United States Patent
Nakamura et al.

(10) Patent No.: US 8,067,928 B2
(45) Date of Patent: Nov. 29, 2011

(54) DC-DC CONVERTER WITH GATE VOLTAGE CONTROL BASED ON OUTPUT CURRENT

(75) Inventors: Kazutoshi Nakamura, Kanagawa-ken (JP); Toshiyuki Naka, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 215 days.

(21) Appl. No.: 12/473,698

(22) Filed: May 28, 2009

(65) Prior Publication Data

US 2009/0295341 A1    Dec. 3, 2009

(30) Foreign Application Priority Data

May 28, 2008    (JP) .................................. 2008-139288

(51) Int. Cl.
G05F 1/565    (2006.01)
G05F 1/575    (2006.01)

(52) U.S. Cl. ....................................... 323/283; 323/285

(58) Field of Classification Search .................. 323/222, 323/282, 283, 285, 286; 363/21.05, 21.13
See application file for complete search history.

(56) References Cited

U.S. PATENT DOCUMENTS

| | | | |
|---|---|---|---|
| 7,026,795 B2 | 4/2006 | So | |
| 7,202,643 B2* | 4/2007 | Miftakhutdinov | 323/224 |
| 7,211,992 B2 | 5/2007 | King | |
| 7,265,601 B2* | 9/2007 | Ahmad | 327/403 |
| 7,372,240 B2* | 5/2008 | Khayat et al. | 323/283 |
| 7,701,189 B2* | 4/2010 | Gehrke | 323/285 |
| 2003/0128015 A1* | 7/2003 | Zuniga et al. | 323/282 |
| 2006/0055574 A1* | 3/2006 | Maksimovic et al. | 341/155 |
| 2006/0170580 A1* | 8/2006 | Lauritzen et al. | 341/155 |
| 2006/0220630 A1* | 10/2006 | Xiao et al. | 323/283 |
| 2007/0177412 A1* | 8/2007 | Sharp | 363/59 |
| 2008/0042632 A1* | 2/2008 | Chapuis et al. | 323/283 |
| 2008/0238392 A1* | 10/2008 | Cheung et al. | 323/283 |
| 2009/0153111 A1* | 6/2009 | Mao et al. | 323/272 |

FOREIGN PATENT DOCUMENTS

| | | |
|---|---|---|
| JP | 2003244946 | 8/2003 |
| JP | 2004-56982 | 2/2004 |
| JP | 2004173460 | 6/2004 |
| JP | 2006-25567 | 1/2006 |
| JP | 2007-68254 | 3/2007 |
| JP | 2007-526739 | 9/2007 |
| JP | 2007325446 | 12/2007 |
| WO | 2006081083 A2 | 8/2006 |

OTHER PUBLICATIONS

Japanese Office Action for Japanese Patent Application No. 2008-139288 Issued on Jan. 19, 2011.
Japanese Office Action issued Nov. 1, 2010 for Japanese Patent Application No. 2008-139288.

* cited by examiner

*Primary Examiner* — Adolf Berhane
*Assistant Examiner* — Fred E Finch, III
(74) *Attorney, Agent, or Firm* — Turocy & Watson, LLP

(57) ABSTRACT

A DC-DC converter includes a high side transistor and a low side transistor connected in series between an input potential and a grounding potential, and an LC filter connected between a connection point of the both transistors and an output terminal. A control unit controls the gate potential of the high side transistor in an ON state and the gate potential of the low side transistor in an ON state according to a magnitude of a current output from the output terminal.

3 Claims, 9 Drawing Sheets

| MOVING AVERAGE IL_tbl[0:n] | PMOS OPTIMAL POTENTIAL Vgp_tbl[0:n] | NMOS OPTIMAL POTENTIAL Vgn_tbl[0:n] |
|---|---|---|
| IL_tbl[0] | Vgp_tbl[0] | Vgn_tbl[0] |
| IL_tbl[1] | Vgp_tbl[1] | Vgn_tbl[1] |
| IL_tbl[2] | Vgp_tbl[2] | Vgn_tbl[2] |
| ⋮ | ⋮ | ⋮ |
| IL_tbl[n] | Vgp_tbl[n] | Vgn_tbl[n] |

FIG. 4

| ERROR SIGNAL E[s] | a × E[s] | b × E[s] | c × E[s] |
|---|---|---|---|
| 0···000 | | | |
| 0···001 | | | |
| 0···010 | | | |
| 0···011 | | | |
| 0···100 | | | |
| ⋮ | ⋮ | ⋮ | ⋮ |
| 1···111 | | | |

FIG. 5

DC-DC CONVERTER WITH GATE VOLTAGE CONTROL BASED ON OUTPUT CURRENT

CROSS-REFERENCE TO RELATED APPLICATIONS

This application is based upon and claims the benefits of priority from the prior Japanese Patent Application No. 2008-139288, filed on May 28, 2008; the entire contents of which are incorporated herein by reference.

BACKGROUND OF THE INVENTION

1. Field of the Invention

The present invention relates to a DC-DC converter.

2. Background Art

Recently, many electronic devices include DC-DC converters that convert a direct current voltage supplied by a power supply into a direct current voltage of a prescribed magnitude. Improvements to the conversion efficiency of DC-DC converters are required to realize a long battery life in battery-driven devices such as portable devices and the like (refer to JP-A 2006-25567 (Kokai)).

SUMMARY OF THE INVENTION

According to an aspect of the invention, there is provided a DC-DC converter including: a high side switching device and a low side switching device connected in series between an input potential and a reference potential; an LC filter connected between an output terminal and a connection point, the connection point being between the high side switching device and the low side switching device; and a control unit that controls a drive voltage of the high side switching device and a drive voltage of the low side switching device according to a magnitude of a current output from the output terminal.

According to another aspect of the invention, there is provided a DC-DC converter including: a high side transistor and a low side transistor connected in series between an input potential and a reference potential; an LC filter connected between an output terminal and a connection point, the connection point being between the high side transistor and the low side transistor; and a control unit that controls a gate voltage of the high side transistor and a gate voltage of the low side transistor according to a magnitude of a current output from the output terminal, the control unit including: a determination unit that determines respectively optimal gate potentials for switching to an ON state for each of the high side transistor and the low side transistor based on the magnitude of the current; a high side regulator that generates the optimal gate potential of the high side transistor; a low side regulator that generates the optimal gate potential of the low side transistor; and a gate driver circuit that alternately realizes a high side state in which the optimal gate potential output by the high side regulator is applied to a gate of the high side transistor to switch the high side transistor to an ON state and the low side transistor is switched to an OFF state, and a low side state in which the optimal gate potential output by the low side regulator is applied to a gate of the low side transistor to switch the low side transistor to the ON state and the high side transistor is switched to the OFF state.

BRIEF DESCRIPTION OF THE DRAWINGS

FIG. 4 illustrates the contents of a lookup table 48 illustrated in FIG. 1;

FIG. 5 illustrates the contents of a lookup table 49 illustrated in FIG. 1;

DETAILED DESCRIPTION OF THE INVENTION

Embodiments of the present invention will be described with reference to the drawings.

First, a first embodiment of the present invention will be described.

Figure 1:
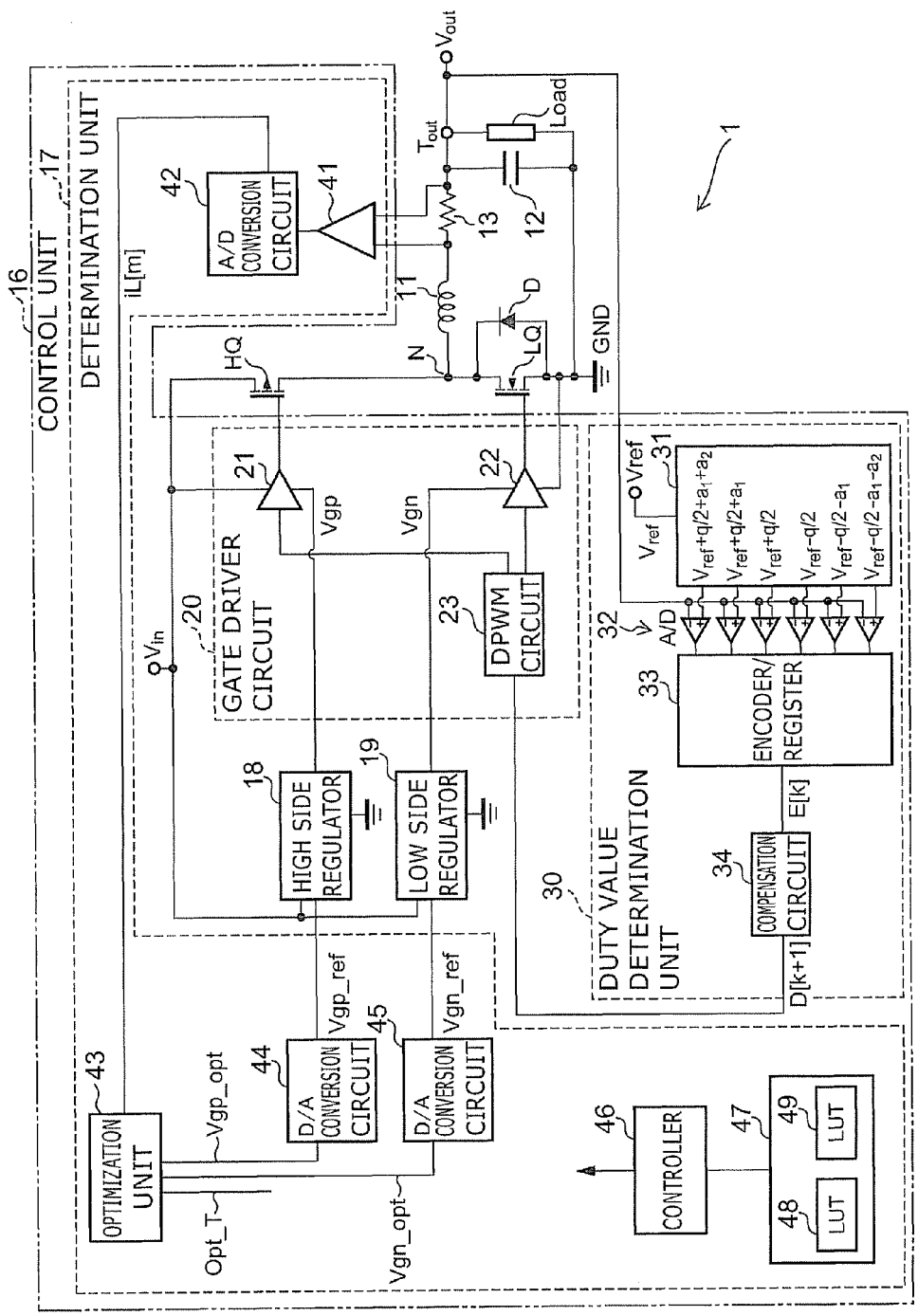
FIG. 1 is a block diagram illustrating a DC-DC converter according to a first embodiment of the invention.

FIG. 1 is a block diagram illustrating a DC-DC converter according to this embodiment.

Figure 2:
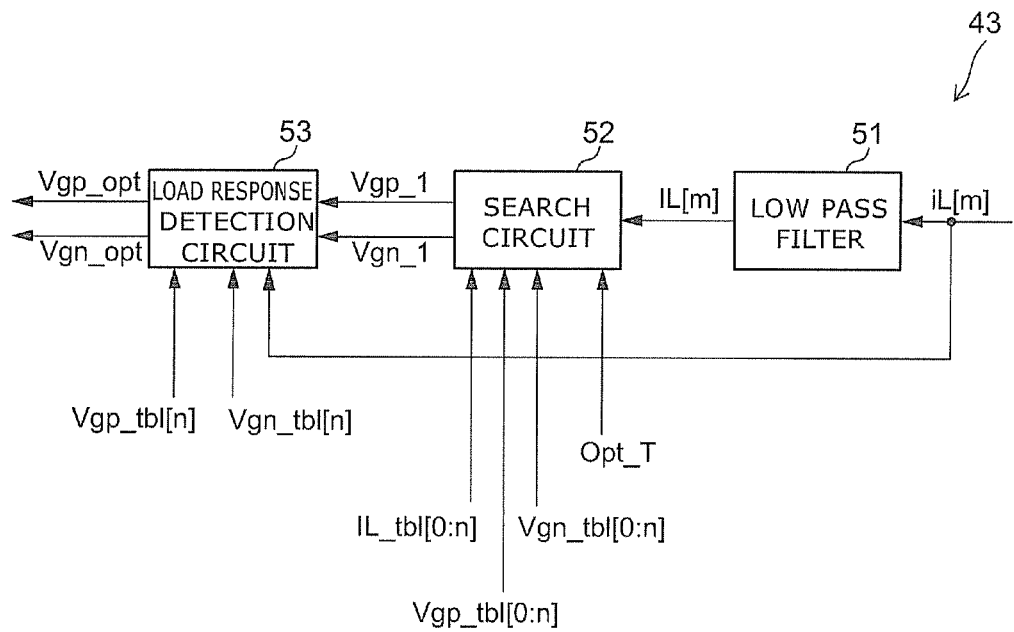
FIG. 2 is a block diagram illustrating an optimization unit illustrated in FIG. 1.

FIG. 2 is a block diagram illustrating an optimization unit illustrated in FIG. 1.

Figure 3:
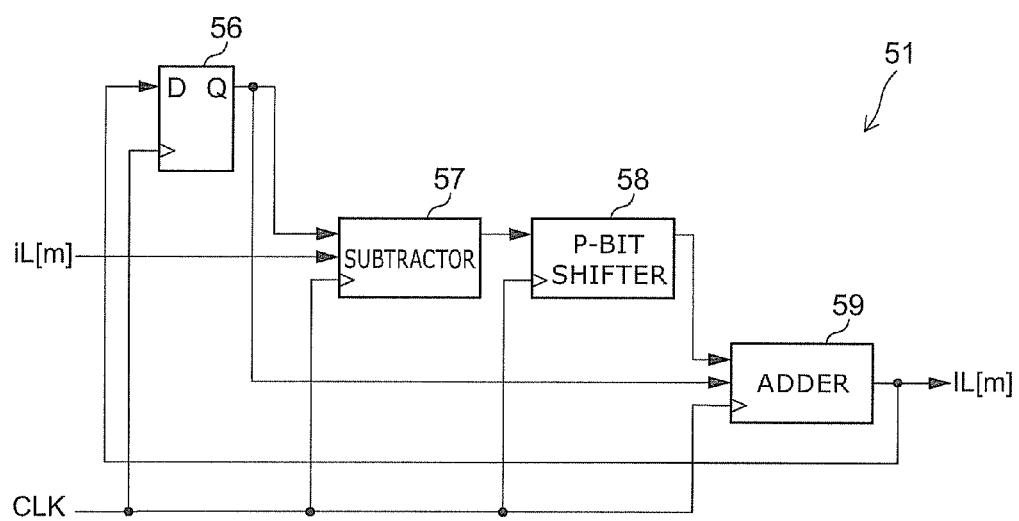
FIG. 3 is a circuit diagram illustrating a low pass filter illustrated in FIG. 2.

FIG. 3 is a circuit diagram illustrating a low pass filter illustrated in FIG. 2.

FIG. 4 illustrates the contents of a lookup table 48 illustrated in FIG. 1.

FIG. 5 illustrates the contents of a lookup table 49 illustrated in FIG. 1.

As illustrated in FIG. 1, a DC-DC converter 1 according to this embodiment is provided with inputs of an input potential $V_{in}$ and a grounding potential GND, i.e., a reference potential, and outputs a direct current having a voltage of an output potential $V_{out}$ between an output terminal $T_{out}$ and the grounding potential GND, where the output potential $V_{out}$ is the potential of the output terminal $T_{out}$. The input potential $V_{in}$ is higher than the grounding potential GND. The DC-DC converter 1 includes a high side transistor HQ as a high side switching device, and a low side transistor LQ as a low side switching device, connected in series between the input potential $V_{in}$ and the grounding potential GND.

The high side transistor HQ is, for example, a P-channel field effect transistor (PMOS). The low side transistor LQ is, for example, an N-channel field effect transistor (NMOS). The input potential $V_{in}$ is applied to the source of the high side transistor HQ; the grounding potential GND is applied to the source of the low side transistor LQ; and the drain of the high side transistor HQ and the drain of the low side transistor LQ are mutually connected at a connection point N. The low side transistor LQ includes a diode D that allows a current to flow only in the direction from the source to the drain.

An inductor 11 is connected between the connection point N and the output terminal $T_{out}$. A capacitor 12 is connected between the output terminal $T_{out}$ and the grounding potential GND. Thereby, an LC filter formed by the inductor 11 and the capacitor 12 is connected between the connection point N and the output terminal $T_{out}$. A resistor 13 is provided between the inductor 11 and the output terminal $T_{out}$. A load ("Load") is connected between the output terminal $T_{out}$ and the grounding potential GND in parallel with the capacitor 12.

The DC-DC converter 1 includes a control unit 16 to control the gate voltage of the high side transistor HQ and the gate voltage of the low side transistor LQ according to the magnitude of the current $I_{out}$ which is output from the output terminal $T_{out}$. The "gate voltage" of a transistor refers to the difference between the gate potential and the source potential. The gate voltage of the high side transistor HQ corresponds to a drive voltage of the high side switching device; and the gate voltage of the low side transistor LQ corresponds to a drive voltage of the low side switching device.

The control unit 16 is provided with a determination unit 17 that determines respectively optimal gate potentials (hereinbelow also referred to as "optimal potential") to minimize losses and switch each of the high side transistor HQ and the low side transistor LQ to an ON state based on the magnitude of the current which is output from the output terminal $T_{out}$. Hereinbelow, the optimal potential of the high side transistor HQ is referred to as a potential Vgp, and the optimal potential of the low side transistor LQ is referred to as a potential Vgn. Also, the difference (Vgp–$V_{in}$) between the optimal gate potential of the high side transistor HQ (optimal potential Vgp) and the input potential $V_{in}$, i.e., the source potential, is referred to as the optimal voltage of the high side transistor HQ; and the difference (Vgn–GND) between the optimal gate potential of the low side transistor LQ (optimal potential Vgn) and the grounding potential GND, i.e., the source potential, is referred to as the optimal voltage of the low side transistor LQ. The configuration of the determination unit 17 is described below.

The control unit 16 includes a high side regulator 18 which is supplied with the input potential $V_{in}$ and the grounding potential GND and generates the optimal potential Vgp determined by the determination unit 17, and a low side regulator 19 which is supplied with the input potential $V_{in}$ and the grounding potential GND and generates the optimal potential Vgn determined by the determination unit 17.

The control unit 16 also includes a gate driver circuit 20 which is supplied with four levels of potentials, that is, the input potential $V_{in}$, the grounding potential GND, the optimal potential Vgp, and the optimal potential Vgn; switches among and applies these potentials to the gate of the high side transistor HQ and the gate of the low side transistor LQ; and thereby causes the high side transistor HQ and the low side transistor LQ to alternately conduct.

The gate driver circuit 20 includes a high side driver 21, a low side driver 22, and a DPWM (Digital Pulse Width Modulation) circuit 23. The DPWM circuit 23 outputs a control signal to each of the high side driver 21 and the low side driver 22, and specifically, is a circuit that generates a switching edge based on a digital value output by the compensation circuit 34 described below.

The high side driver 21 is supplied with the input potential $V_{in}$ and the optimal potential Vgp, and switches between and applies these potentials to the gate of the high side transistor HQ based on the control signal input from the DPWM circuit 23. The high side transistor HQ is switched to the OFF state when the input potential $V_{in}$ is applied to the gate, and switches to the ON state when the optimal potential Vgp is applied.

The low side driver 22 is supplied with the grounding potential GND and the optimal potential Vgn, and switches between and applies these potentials to the gate of the low side transistor LQ based on the control signal input from the DPWM circuit 23. The low side transistor LQ is switched to the ON state when the optimal potential Vgn is applied to the gate, and switches to the OFF state when the grounding potential GND is applied.

Then, the DPWM circuit 23 alternately realizes, at a constant switching period, a high side state in which the high side driver 21 is caused to output the optimal potential Vgp and the low side driver 22 is caused to output the grounding potential GND, and a low side state in which the high side driver 21 is caused to output the input potential $V_{in}$ and the low side driver 22 is caused to output the optimal potential Vgn. The proportion of the realization time of the high side state and the realization time of the low side state in one switching period is determined by a duty value D[k] input into the DPWM circuit 23.

The control unit 16 includes a duty value determination unit 30 that determines the duty value D[k] based on the output potential $V_{out}$ which is output from the output terminal $T_{out}$ and a referred potential $V_{ref}$ which is input from the exterior of the DC-DC converter 1. The duty value determination unit 30 includes a D/A conversion circuit 31 which is provided with an input of a digital signal Vref that indicates the value of the referred potential $V_{ref}$ and outputs multiple levels of analog signals based on the digital signal Vref.

The duty value determination unit 30 also includes a flash A/D conversion circuit 32 that compares each analog signal of the multiple levels output by the D/A conversion circuit 31 to the output potential $V_{out}$ and outputs each result as a one-bit binary signal. The A/D conversion circuit 32 has a configuration in which multiple comparison circuits are connected in parallel. Each comparison circuit is provided with inputs of one level of the analog signal and the output potential $V_{out}$; compares these inputs; and outputs the result as one binary signal.

The duty value determination unit 30 further includes an encoder/register 33 that converts the multiple binary signals output by the A/D conversion circuit 32 into one digital error signal E[k], accumulates the result in a register, and then outputs the result. The duty value determination unit 30 also includes a compensation circuit 34 that determines a duty value of the next switching cycle D[k+1] based on the error signal E[k] which is output by the encoder/register 33 and outputs the result to the DPWM circuit 23. The compensation circuit 34 refers to a lookup table 49 stored in a storage unit 47 described below and calculates the duty value D[k+1] according to the error signal E[k]. A general calculation formula that calculates the duty value D[k+1] by PID control (Proportional plus Integral plus Derivative control) can be expressed by Formula (1) recited below, where a, b, and c are constants.

$$D[k+1]=D[k]+a\times E[k]+b\times E[k-1]+c\times E[k-2] \quad (1)$$

As illustrate in Formula (1) recited above, the duty value of the next switching cycle D[k+1] is the summation of the duty value of the current switching cycle D[k], the current error signal E[k] multiplied by the constant a, the error signal of the first previous switching cycle E[k−1] multiplied by the constant b, and the error signal of the second previous switching cycle E[k−2] multiplied by the constant c. Thereby, it is possible to perform the calculation and utilize the result in the next switching cycle in real time based on the error signals up to the current switching cycle.

The determination unit 17 includes a current amplifier 41 that measures the magnitude of a current flowing in the resistor 13 by measuring a voltage between both ends of the resistor 13. The magnitude of the current flowing in the resistor 13 is nearly equal to a magnitude of the current $I_{out}$ flowing from the output terminal $T_{out}$ through the Load to the grounding potential GND. Therefore, the current amplifier 41 functions as a measurement unit that measures the magnitude of the output current $I_{out}$ which is output from the output terminal $T_{out}$; and an analog signal that indicates the magnitude of the current $I_{out}$ is output by the current amplifier 41. The determination unit 17 also includes an A/D conversion circuit 42 that converts the analog signal output by the current amplifier 41 into a digital signal iL[m] at a constant period. The digital signal iL[m] is a signal that successively indicates the magnitude of the output current $I_{out}$.

The determination unit 17 further includes an optimization unit 43 into which the digital signal iL[m] is input from the A/D conversion circuit 42. The optimization unit 43 acquires the optimal potential Vgp of the high side transistor HQ, that is, the gate potential that switches the high side transistor HQ to the ON state and minimizes the power loss of the high side transistor HQ, based on the digital signal iL[m]. The optimization unit 43 also acquires the optimal potential Vgn of the low side transistor LQ, that is, the gate potential that switches the low side transistor LQ to the ON state and minimizes the power loss of the low side transistor LQ, based on the digital signal iL[m]. The optimization unit 43 outputs these potentials as digital signals Vgp_opt and Vgn_opt, respectively.

The determination unit 17 also includes a D/A conversion circuit 44 which converts the digital signal Vgp_opt output by the optimization unit 43 into an analog signal Vgp_ref and outputs the result to the high side regulator 18. The determination unit 17 further includes a D/A conversion circuit 45 which converts the digital signal Vgn_opt output by the optimization unit 43 into an analog signal Vgn_ref and outputs the result to the low side regulator 19.

The determination unit 17 additionally includes a controller 46. The controller 46 exchanges signals with the compensation circuit 34 and the optimization unit 43 and causes the compensation circuit 34 and the optimization unit 43 to operate. For example, the controller 46 outputs a drive signal Opt_T to the optimization unit 43. The controller 46 connects to a memory 47. The memory 47 includes, for example, an EPROM (Erasable and Programmable Read Only Memory). Lookup tables (hereinbelow also referred to as "LUTs") 48 and 49 are stored in the memory 47.

As illustrated in FIG. 2, the optimization unit 43 includes a low pass filter 51, a search circuit 52, and a load response detection circuit 53. The low pass filter 51 is a circuit that smoothes the digital signal iL[m] supplied by the A/D conversion circuit 42, and specifically, is a circuit that generates a moving average IL[m] based on the digital signal iL[m]. The search circuit 52 is a circuit that refers to the lookup table 48 and acquires the value of the optimal potential Vgp and the value of the optimal potential Vgn based on the moving average IL[m] when the drive signal Opt_T is ON. The load response detection circuit 53 is a circuit that outputs the values of the optimal potential Vgp and the optimal potential Vgn acquired by the search circuit 52 as the output signal Vgp_opt and the output signal Vgn_opt, respectively, when the value of the digital signal iL[m] is equal to or less than a reference value, and outputs gate potentials from the gate potentials written to the lookup table 48 to maximize the absolute values of the gate voltages when the value of the digital signal iL[m] exceeds the reference value.

As illustrated in FIG. 3, the low pass filter 51 includes a D latch 56, a subtractor 57, a P-bit shifter 58, and an adder 59. A common clock signal CLK is input into each of the D latch 56, the subtractor 57, the P-bit shifter 58, and the adder 59. The subtractor 57 is provided with inputs of the digital signal iL[m] and an output Q of the D latch 56, and outputs a subtraction result thereof to the P-bit shifter 58. The adder 59 is provided with inputs of the output of the P-bit shifter 58 and the output Q of the D latch 56; outputs an addition result thereof to an input D of the D latch 56; and outputs the addition result thereof to the exterior of the low pass filter 51 as the moving average IL[m].

As illustrated in FIG. 4, the lookup table (LUT) 48 includes multiple levels of each of the values of the moving average IL[m], the values of the optimal potential Vgp of the high side transistor HQ (PMOS) corresponding to the values of the moving average IL[m], and the values of the optimal potential Vgn of the low side transistor LQ (NMOS) corresponding to the values of the moving average IL[m]. Hereinbelow, the values written to the LUT 48 are referred to as "table values."

The array names of the table values of the moving average IL[m] are IL_tbl[0] to IL_tbl[n]. The array names of the table values of the optimal potential Vgp are Vgp_tbl[0] to Vgp_tbl[n]. The array names of the table values of the optimal potential Vgn are Vgn_tbl[0] to Vgn_tbl[n]. In other words, the table values of each are arrays with n values (n being an integer of two or more); and the values of the optimal potentials Vgp and Vgn are Vgp_tbl[j] and Vgn_tbl[j], respectively, when the value of the moving average IL[m] is IL_tbl[j] (j being an integer from 0 to n).

In the lookup table 48, the table values IL_tbl[0] to IL_tbl[n] of the moving average IL[m] are arranged in ascending order. In other words, the relationship IL_tbl[j−1]<IL_tbl[j] holds. The smallest table value IL_tbl[0] is 0 A (zero amperes). Further, as the value of the moving average IL[m] (IL_tbl[j]) decreases, the value of the optimal potential Vgp (Vgp_tbl[j]) increases, and the value of the optimal potential Vgn (Vgn_tbl[j]) decreases. Thereby, as the value of the moving average IL[m] decreases, the optimal potential Vgp approaches the input potential $V_{in}$, and the absolute value of the optimal voltage of the high side transistor HQ (Vgp−$V_{in}$) decreases. Also, as the value of the moving average IL[m] decreases, the optimal potential Vgn approaches the grounding potential GND, and the absolute value of the optimal voltage of the low side transistor LQ (Vgn−GND) decreases.

On the other hand, as illustrated in FIG. 5, the lookup table 49 includes the values of the error signal E[s], that is, the values represented by the number series 0 . . . 000 to 1 . . . 111, and the products a×E[s], b×E[s], and c×E[s] of each value of the error signal E[s] multiplied by each constant. The values of a×E[k], b×E[k−1], and c×E[k−2] can be read by using values of k, k−1, and k−2 for the parameter s. Thus, it is possible to execute the operation of Formula (1) recited above by performing merely addition without performing multiplication, by using the lookup table 49. As a result, the operation can be executed at high speed, and the consumed current necessary for the operation can be reduced.

An operation of the DC-DC converter according to this embodiment having the configuration described above will now be described.

First, when the DC-DC converter 1 is initiated, the controller 46 reads the values of the lookup tables (LUTs) 48 and 49 from a storage unit (not illustrated) in the exterior and stores the values in the memory 47. Thereby, the LUTs 48 and 49 are created in the memory 47. The values of the LUTs 48 and 49 stored in the memory 47 are continuously retained unless re-written from the exterior.

In this state, the input potential $V_{in}$ and the grounding potential GND are applied to the DC-DC converter 1; and a direct current having a voltage of the output potential $V_{out}$ is output between the output terminal $T_{out}$ and the grounding potential GND, where the output potential $V_{out}$ is the voltage of the output terminal $T_{out}$. At this time, the gate voltage of the high side transistor HQ and the gate voltage of the low side transistor LQ are controlled according to the magnitude of the output current $I_{out}$. The output potential $V_{out}$ is compensated based on the difference between the output potential $V_{out}$ and the referred potential $V_{ref}$. Each of the operations is described below.

First, a basic operation of the DC-DC converter 1, that is, an operation that generates the direct current of the output potential $V_{out}$ from the input potential $V_{in}$ and the grounding potential GND will be described.

As illustrated in FIG. 1, the high side regulator 18 generates the optimal potential Vgp based on the analog signal Vgp_ref input from the D/A conversion circuit 44 and outputs the result to the high side driver 21. The low side regulator 19 generates the optimal potential Vgn based on the analog signal Vgn_ref input from the D/A conversion circuit 45 and outputs the result to the low side driver 22. Thereby, the input potential $V_{in}$ and the optimal potential Vgp are supplied to the high side driver 21; and the grounding potential GND and the optimal potential Vgn are supplied to the low side driver 22.

On the other hand, the DPWM circuit 23 outputs control signals to the high side driver 21 and the low side driver 22 based on the duty value D[k+1] input from the duty value determination unit 30. Thereby, the high side state in which the high side driver 21 is caused to output the optimal potential Vgp and the low side driver 22 is caused to output the grounding potential GND, and the low side state in which the high side driver 21 is caused to output the input potential $V_{in}$ and the low side driver 22 is caused to output the optimal potential Vgn, are alternately realized at a constant switching period. In the high side state, the high side transistor HQ is in the ON state, and the low side transistor LQ is in the OFF state. Thereby, the potential of the connection point N is nearly the input potential $V_{in}$. In the low side state, the low side transistor LQ is in the ON state, and the high side transistor HQ is in the OFF state. Thereby, the potential of the connection point N is nearly the grounding potential GND.

Restated, the gate driver circuit 20 alternately realizes the high side state in which the optimal potential Vgp output by the high side regulator 18 is applied to the gate of the high side transistor HQ to switch the high side transistor HQ to the ON state and the grounding potential GND is applied to the gate of the low side transistor LQ to switch the low side transistor LQ to the OFF state, and the low side state in which the optimal potential Vgn output by the low side regulator 19 is applied to the gate of the low side transistor LQ to switch the low side transistor LQ to the ON state and the input potential $V_{in}$ is applied to the gate of the high side transistor HQ to switch the high side transistor HQ to the OFF state.

As a result, the potential of the connection point N oscillates between the input potential $V_{in}$ and the grounding potential GND. The oscillation of the potential is smoothed by the LC circuit made of the inductor 11 and the capacitor 12 and the output potential $V_{out}$ of the output terminal $T_{out}$ is substantially constant. For example, the output potential $V_{out}$ is about 1 V in the case where the input potential $V_{in}$ is 5 V (volts), the grounding potential GND is 0 V, and the duty value D[k] is 20%, that is, the ratio of the time that the high side transistor HQ is in the ON state to the time that the low side transistor LQ is in the ON state is (1:4).

The operation that controls the gate voltage of the transistors according to the magnitude of the output current $I_{out}$ will now be described.

Figure 6:
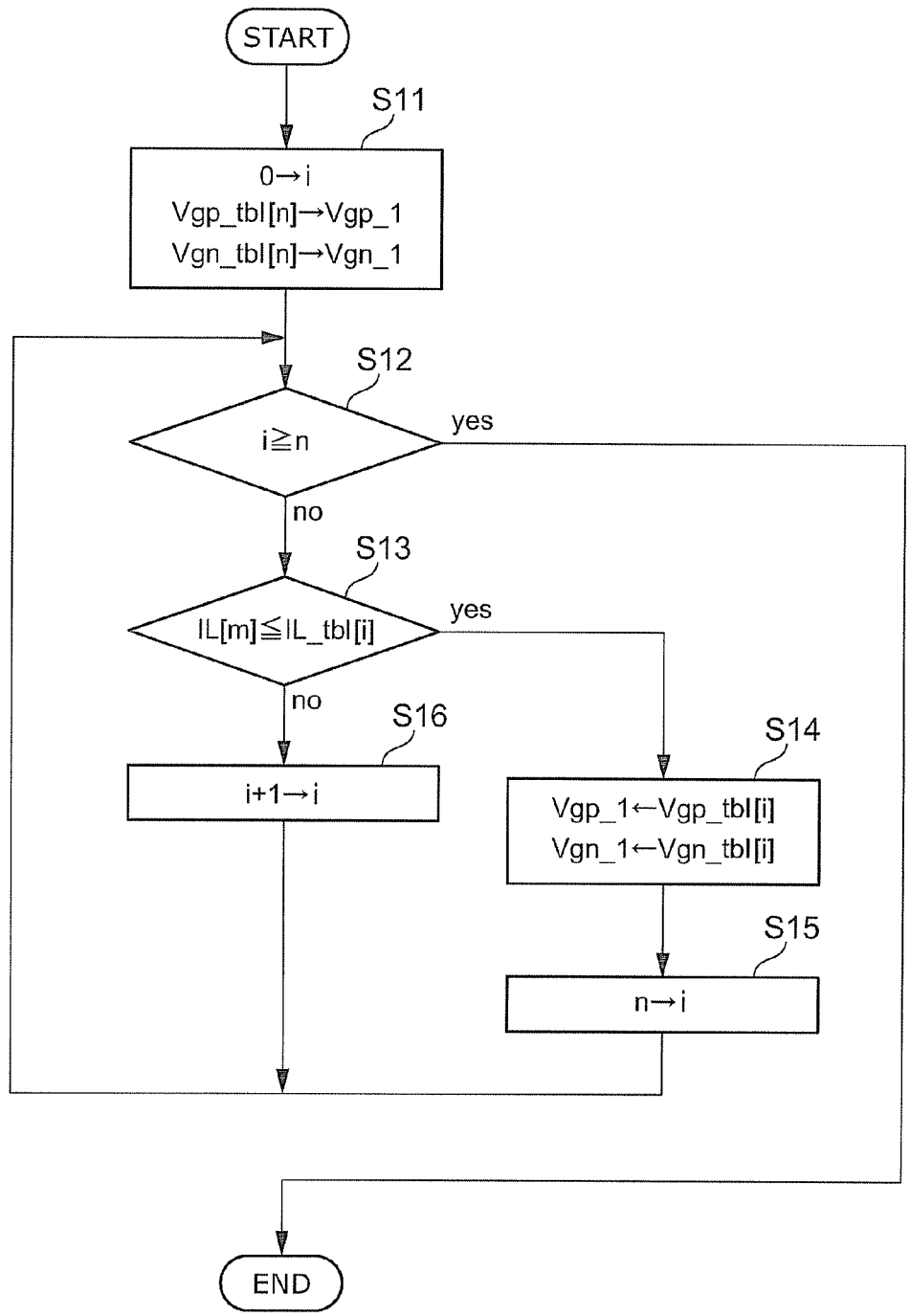
FIG. 6 is a flowchart illustrating an operation of a search circuit.

FIG. 6 is a flowchart illustrating the operation of the search circuit.

Figure 7:
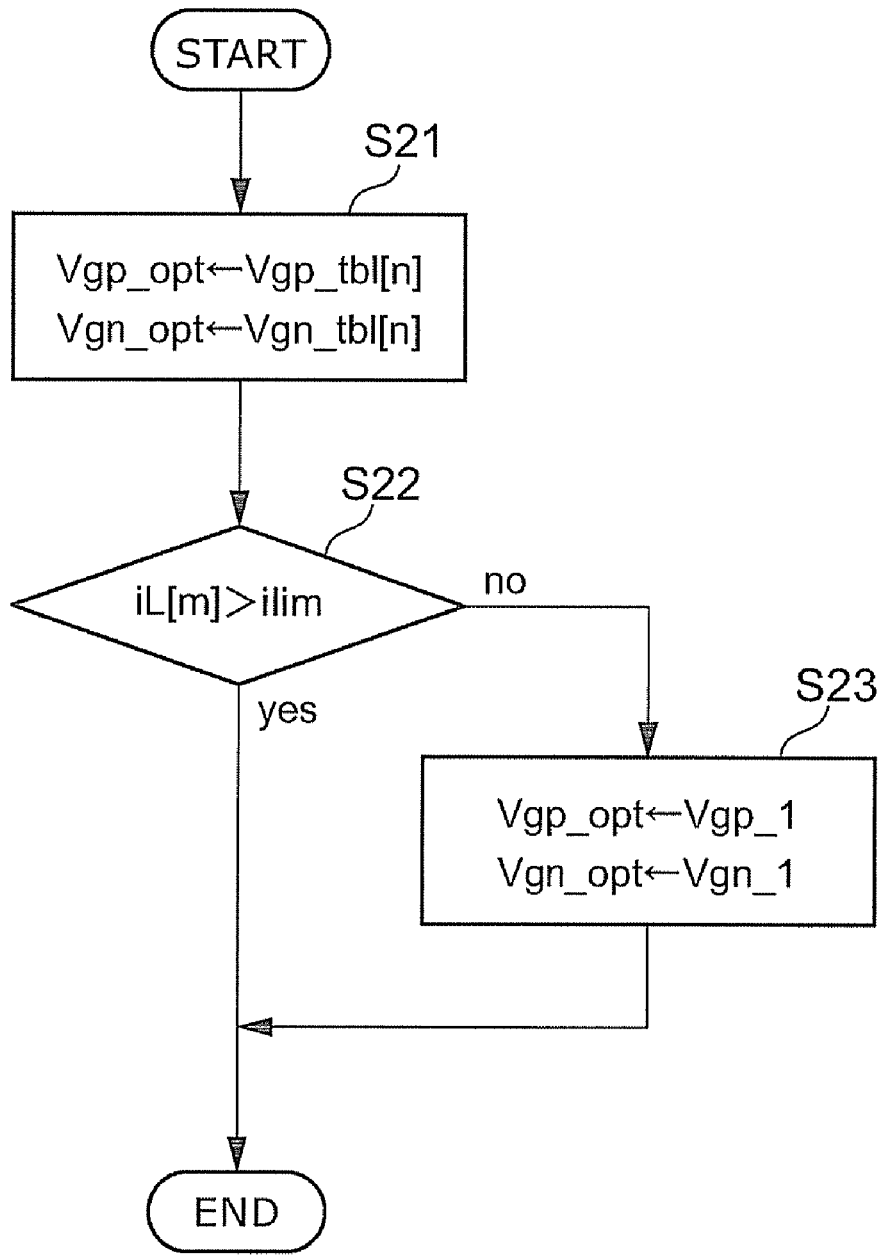
FIG. 7 is a flowchart illustrating an operation of a load response detection circuit.

FIG. 7 is a flowchart illustrating the operation of the load response detection circuit.

First, as illustrated in FIG. 1, the current amplifier 41 measures the magnitude of the current flowing in the resistor 13 based on the voltage between both ends of the resistor 13. Thereby, the magnitude of the output current $I_{out}$ which is output from the output terminal $T_{out}$ to the Load is measured. The measurement result is then output to the A/D conversion circuit 42 as an analog signal. Then, the A/D conversion circuit 42 converts the analog signal to the digital signal iL[m] at a constant period and outputs the result to the optimization unit 43.

As illustrated in FIG. 2, the digital signal iL[m] which is input into the optimization unit 43 is input into the low pass filter 51 and the load response detection circuit 53. The low pass filter 51 calculates the moving average IL[m] from the digital signal iL[m] that successively indicates the magnitude of the output current $I_{out}$ by, for example, the following method.

That is, as illustrated in FIG. 3, the digital signal iL[m] which is input into the low pass filter 51 is input into the subtractor 57. The following operations are performed by the D latch 56, the subtractor 57, the P-bit shifter 58, and the adder 59. The operation result thereof is output by the adder 59 as the moving average IL[m].

Specifically, the low pass filter 51 performs the operations illustrated in Formulas (2) to (5) recited below. Here, P is assumed to be a positive integer. a is set to a small value, and therefore (1−a) is a value nearly equal to unity.

$$IL[m]=(1-a) \times IL[m-1]+a \times iL[m] \quad (2)$$

$$a=1/(2^P) \quad (3)$$

Similar to Formula (2) recited above, the value of IL[m−1] can be calculated by Formula (4) recited below.

$$IL[m-1]=(1-a) \times IL[m-2]+a \times iL[m-1] \quad (4)$$

Formula (5) recited below holds from Formulas (2) and (4) recited above.

$$IL[m]=(1-a)^2 \times IL[m-2]+a \times (1-a) \times iL[m-1]+a \times iL[m] \quad (5)$$

As shown in Formula (5) recited above, the effect of new information (iL[m]) on the moving average IL[m] is small, and the effect of previously added information (IL[m−2]) is large. a is set as in Formula (3) recited above in this embodiment. The result can be ascertained thereby merely by a shift operation. Therefore, the hardware necessary for the operation can be reduced.

As illustrated in FIG. 2, the moving average IL[m] calculated by the low pass filter 51 is input into the search circuit 52. On the other hand, the controller 46 sends the drive signal Opt_T to the search circuit 52. Although the drive signal Opt_T normally is OFF, the drive signal Opt_T is ON once every several switching periods. When the drive signal Opt_T is ON, the search circuit 52 operates according to the following algorithm. This configuration reduces the power consumption by allowing the search circuit 52 to avoid continuous operation.

The operation of the search circuit 52 will now be described.

First, as illustrated in step S11 of FIG. 6, "0" is substituted into a parameter i. The lookup table (LUT) 48 stored in the memory 47 is referred to via the controller 46, and the value of Vgp_1 is set to Vgp_tbl[n], that is, the value written to the last line of the table values of the optimal potential Vgp written to the LUT 48 illustrated in FIG. 4. Similarly, the value of Vgn_1 is set to the value Vgn_tbl[n] which is written to the last line.

Then, as illustrated in step S12, it is determined whether or not the parameter i is equal to or greater than n. In the case where the determination result is "no," that is, i<n, the flow proceeds to step S13; and in the case where the determination result is "yes," that is, i≧n, the operation ends. When step S12 is initially executed, i=0 is set in step S11; and therefore, i<n necessarily holds, and the flow proceeds to step S13.

Step S13 determines whether or not the value of the input moving average IL[m] is equal to or less than IL_tbl[i]. In the case where IL[m]≦IL_tbl[i], the flow proceeds to step S14. Otherwise, the flow proceeds to step S16. For example, when step S13 is initially executed, i=0; and therefore, IL[m] is compared to IL_tbl[0].

In step S14, the value of Vgp_1 is set to Vgp_tbl[i] and the value of Vgn_1 is set to Vgn_tbl[i] by referring to the LUT 48. Then, the value of the parameter i is set to n in step S15, and the flow proceeds through step S12 and ends. On the other hand, the value of the parameter i is increased by one in step S16, and the flow returns to step S12.

By repeating the algorithm of step S12 to step S16, the values of Vgp_1 and Vgn_1 are set to Vgp_tbl[i] and Vgn_tbl[i], respectively, when the value of IL[m] is in a range such that IL_tbl[i−1]<IL[m]≦IL_tbl[i]. Thereby, the values of IL[m] can be divided by rank for each range thereof corresponding to the values of Vgp_tbl[i] and Vgn_tbl[i]. Thus, the table values IL_tbl[0:n] can be set more roughly than IL[m]. Restated, the number n of table values IL_tbl[0:n] may be fewer than the number of levels of the moving average IL[m], and the capacity of the memory 47 can be reduced. In the case where the value of IL[m] is greater than the maximum value (IL_tbl[n]) of the table values IL_tbl[0:n], the values of Vgp_1 and Vgn_1 are Vgp_tbl[n] and Vgn_tbl[n], respectively, as set in step S11.

Thus, the search circuit 52 refers to the lookup table 48 and acquires the values of Vgp_1 and Vgn_1. At this time, the table value (Vgp_tbl[j]) of the optimal potential Vgp increases and the table value (Vgn_tbl[j]) of the optimal potential Vgn decreases as the table value (IL_tbl[j]) of the moving average IL[m] decreases. Therefore, the absolute value of the gate voltage of the high side transistor HQ ($V_{in}$−Vgp) and the absolute value of the gate voltage of the low side transistor LQ (Vgn−GND) decreases.

Thus, the search circuit 52 acquires the values of Vgp_1 and Vgn_1 based on the moving average IL[m] of the smoothed signal iL[m] that successively indicates the magnitude of the output current $I_{out}$ of the DC-DC converter 1. Therefore, even in the case where the magnitude of the output current $I_{out}$ changes abruptly, the values of Vgp_1 and Vgn_1 do not follow the changes. Thereby, the effects recited below are obtained.

As described below, the values of Vgp_1 and Vgn_1 determine the gate potentials for switching the transistors HQ and LQ to the ON state. Therefore, in the case where the values of Vgp_1 and Vgn_1 change abruptly, the gate potentials of the ON state of the transistors HQ and LQ also change abruptly. On the other hand, the gates of the transistors HQ and LQ are each connected to capacitors (not illustrated) in the exterior. By exchanging charge with each capacitor, the gate potentials are periodically changed for the switching cycles of the transistors HQ and LQ. It is necessary to recharge the gate and the capacitor to increase the gate potential in the ON state; and it is necessary to drain the charge accumulated in the gate and the capacitor to ground to decrease the gate potential in the ON state. The drained charge is wasted power not supplied to the load. Therefore, in the case where the gate potential in the ON state is changed too abruptly, the wasted power increases, and the conversion efficiency of the DC-DC converter 1 decreases. Therefore, the search circuit 52 determines the values of Vgp_1 and Vgn_1 based on the moving average IL[m] rather than the signal iL[m]. Thereby, the change of the gate potential in the ON state of the transistors HQ and LQ is moderate and the occurrence of wasted power is inhibited.

However, in the case such as where, for example, devices forming the Load are switched from a standby state to an active state, and in the case where the output current that flows in the Load increases abruptly and greatly, the operations of the low pass filter 51 and the search circuit 52 described above are insufficient to cope with the increase of the output current; and the output potential $V_{out}$ undesirably is lower than the set potential. This result is because, as described above, in the case where the output current is small, the absolute value of the gate voltage in the ON state of the transistors HQ and LQ is set low, and the ON resistance of the transistors HQ and LQ is high. This result also is because the effect of new information is expected to be small when the low pass filter 51 generates the moving average IL[m] from the signal iL[m], and therefore a certain amount of time is necessary from the instantaneous increase of the magnitude of the output current $I_{out}$ until the value of the moving average IL[m] increases and the gate potential in the ON state changes.

Therefore, this embodiment includes the load response detection circuit 53 of the optimization unit 43 so that, in the case where the magnitude of the output current $I_{out}$ flowing in the Load instantaneously increases and exceeds the reference value, the output current is increased and the low pass filter 51 and the search circuit 52 are bypassed. Thereby, it is possible to cope in the case where the state of the load changes abruptly.

The operation of the load response detection circuit 53 will now be described.

As illustrated in FIG. 2, the values of Vgp_1 and Vgn_1 acquired by the search circuit 52 are output to the load response detection circuit 53. The digital signal iL[m] also is input into the load response detection circuit 53.

As illustrated in step S21 of FIG. 7, the load response detection circuit 53 refers to the LUT 48 stored in the memory 47 via the controller 46 and sets the value of Vgp_opt to Vgp_tbl[n], that is, the minimum value written to the last line of the table values of the optimal potential Vgp written to the LUT 48. Similarly, the value of Vgn_opt is set to Vgn_tbl[n], that is, the maximum value written to the last line of the table values of the optimal potential Vgn written to the LUT 48.

Then, as illustrated in step S22, it is determined whether or not the value of the signal iL[m] input from the A/D conversion circuit 42 is greater than a reference value ilim. In the case where the determination result is "yes," that is, iL[m]>ilim, the operation ends. At this time, the values of Vgp_opt and Vgn_opt are Vgp_tbl[n] and Vgn_tbl[n], respectively, as set in step S21. On the other hand, in the case where the determination result is "no," that is, iL[m]≦ilim, the flow proceeds to step S23. In step S23, the values of Vgp_opt and Vgn_opt are set to the Vgp_1 and Vgn_1 values, respectively, acquired by the search circuit 52. Then, the operation ends.

In other words, the load response detection circuit 53 outputs Vgp_tbl[n] and Vgn_tbl[n] as Vgp_opt and Vgn_opt, respectively, in the case where the value of iL[m] is greater than the reference value ilim, and otherwise outputs Vgp_1 and Vgn_1. Thereby, in the case where the magnitude of the output current flowing in the load exceeds the reference value, the values of Vgp_opt and Vgn_opt are set to the values written to the last lines without waiting for the low pass filter 51 and the search circuit 52 to follow; and a maximum current flows in the transistors HQ and LQ. As a result, even in the case where the state of the load changes, the output potential $V_{out}$ can be maintained at a constant.

Thus, as illustrated in FIG. 1, the optimization unit 43 outputs the digital signal Vgp_opt to the D/A conversion circuit 44 and outputs the digital signal Vgn_opt to the D/A conversion circuit 45. The D/A conversion circuit 44 converts the digital signal Vgp_opt into the analog signal Vgp_ref and outputs the result to the high side regulator 18. The D/A conversion circuit 45 converts the digital signal Vgn_opt into the analog signal Vgn_ref and outputs the result to the low side regulator 19. As a result, the gate voltages in the ON state of the high side transistor HQ and the low side transistor LQ can be controlled according to the magnitude of the output current $I_{out}$.

The operation that compensates the output potential $V_{out}$ based on the difference between the output potential $V_{out}$ and the referred potential $V_{ref}$ will now be described.

As illustrated in FIG. 1, the digital signal Vref that indicates the referred potential $V_{ref}$ is input into the D/A conversion circuit 31 of the duty value determination unit 30 from the exterior of the DC-DC converter 1. The D/A conversion circuit 31 outputs analog signals of multiple levels based on the digital signal Vref. For example, analog signals are output at six levels having potentials of $(V_{ref}+q/2+a_1+a_2)$, $(V_{ref}+q/2+a_1)$, $(V_{ref}+q/2)$, $(V_{ref}-q/2)$, $(V_{ref}-q/2-a_1)$, and $(V_{ref}-q/2-a_1-a_2)$, respectively, where each of q, $a_1$, and $a_2$ is any appropriate value. Although this embodiment is illustrated by an example using six levels of analog signals, the number of levels of the analog signals is not limited to six levels.

Then, each comparison circuit of the A/D conversion circuit 32 compares each analog signal to the output potential $V_{out}$ and outputs each result to the encoder/register 33 as a one-bit binary signal. The encoder/register 33 converts the multiple binary signal inputs into one digital error signal E[k] and accumulates the result in the register.

Specifically, in the case where the D/A conversion circuit 31 outputs, for example, the six levels of analog signals described above, the A/D conversion circuit 32 includes six comparison circuits; and six binary signals are input into the encoder/register 33. Accordingly, the number of bits of the signals input into the encoder/register 33 is a total of six bits. However, the output results of the comparison circuits of the A/D conversion circuit 32 are mutually related. For example, in the case where the output potential $V_{out}$ is higher than the potential $(V_{ref}+q/2+a_1+a_2)$, the output potential $V_{out}$ is necessarily higher than the other five levels of potentials; and in the case where the output potential $V_{out}$ is equal to the referred potential $V_{ref}$, the output potential $V_{out}$ is necessarily lower than $(V_{ref}+q/2+a_1+a_2)$, $(V_{ref}+q/2+a_1)$, and $(V_{ref}+q/2)$ and higher than $(V_{ref}-q/2)$, $(V_{ref}-q/2-a_1)$, and $(V_{ref}-q/2-a_1-a_2)$, and so on. Therefore, only seven arrays, that is, for example, (111111), (011111), (001111), (000111), (000011), (000001), and (000000), are possible for the six binary signals. Accordingly, the encoder/register 33 can convert the array into a three-bit digital signal and output the result as the error signal E[k].

Then, the compensation circuit 34 refers to the lookup table 49 stored in the memory 47 via the controller 46; acquires the table values a×E[k], b×E[k−1], and c×E[k−2] corresponding to the value of the input error signal; adds these values to the current duty value D[k]; and thereby calculates the duty value of the next switching cycle D[k+1]. Then, the duty value D[k+1] is output to the DPWM circuit 23.

The DPWM circuit 23 outputs control signals to the high side driver 21 and the low side driver 22 based on the input duty value D[k+1]. Thereby, the proportion of the time that the high side transistor HQ is in the ON state and the time that the low side transistor LQ is in the ON state is controlled to adjust the output potential $V_{out}$.

At this time, as the output potential $V_{out}$ exceeds the referred potential $V_{ref}$, the duty value is reduced, and the proportion of the time that the high side transistor HQ is in the ON state is reduced. Thereby, the output potential $V_{out}$ is corrected to be lower. Conversely, as the output potential $V_{out}$ decreases below the referred potential $V_{ref}$, the duty value is increased, and the proportion of the time that the high side transistor HQ is in the ON state is increased. Thereby, the output potential $V_{out}$ is corrected to be higher. As a result, the duty value determination unit 30 can compensate the output potential $V_{out}$ to match the referred potential $V_{ref}$.

Effects of this embodiment will now be described.

Figure 8:
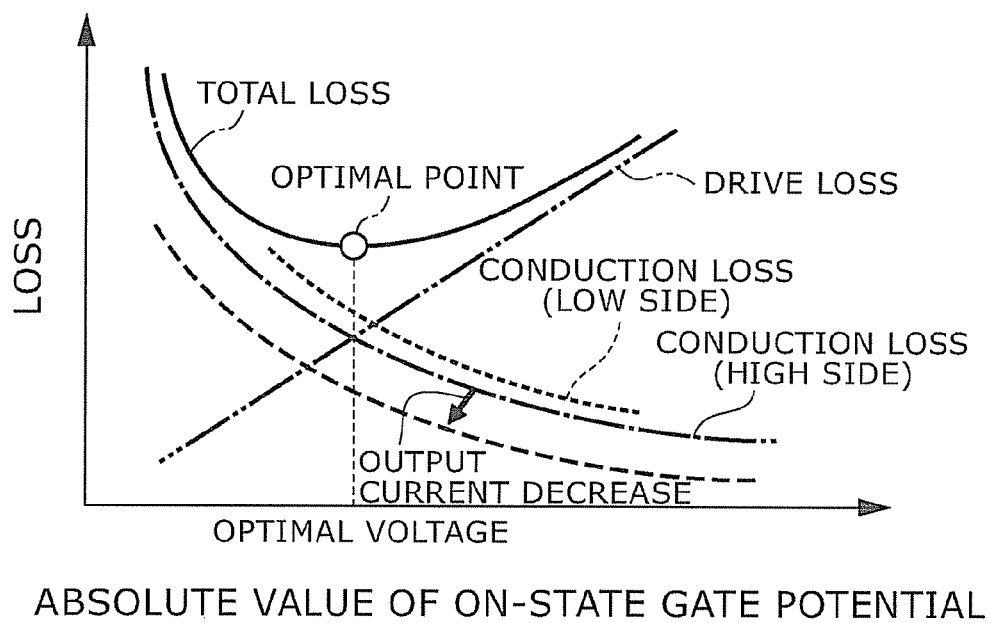
FIG. 8 is a graph illustrating an optimal value of a gate voltage in an ON state with an absolute values of the gate voltages in the ON state of a high side transistor and a low side transistor of the DC-DC converter on the horizontal axis and a loss on the vertical axis.

FIG. 8 is a graph illustrating the optimal value of the gate voltage in the ON state with the absolute values of the gate voltages in the ON state of the high side transistor and the low side transistor of the DC-DC converter on the horizontal axis and the loss on the vertical axis.

Figure 9:
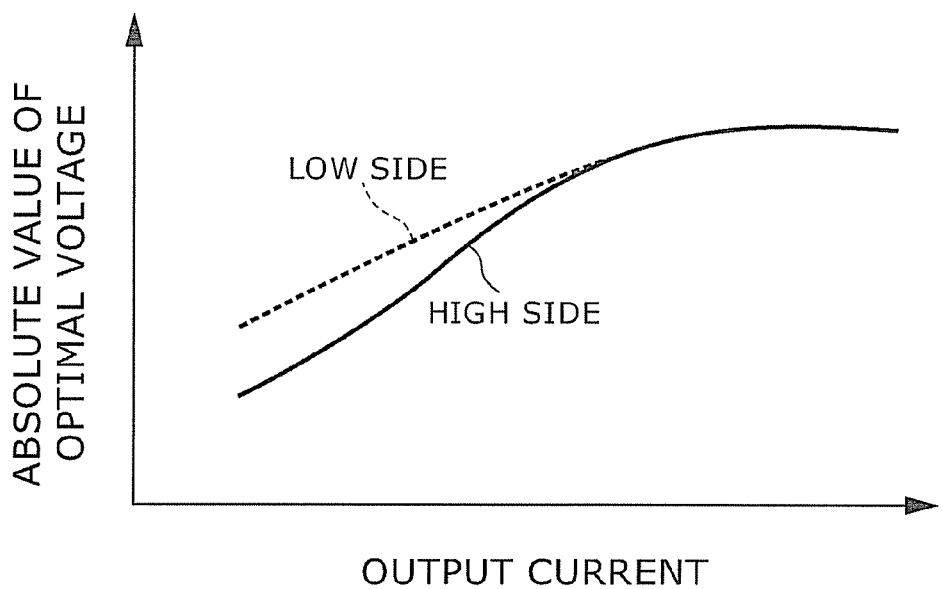
FIG. 9 is a graph illustrating the relationship between a magnitude of an output current and an optimal voltage with the magnitude of the output current on the horizontal axis and an absolute value of the optimal voltage on the vertical axis.

FIG. 9 is a graph illustrating the relationship between the magnitude of the output current and the optimal voltage with the magnitude of the output current on the horizontal axis and the absolute value of the optimal voltage on the vertical axis.

The conversion efficiency of the DC-DC converter is defined as the ratio of the output power to the input power. In other words, the conversion efficiency η can be expressed by Formula (6) recited below, where $V_{in}$ is the input potential, $I_{in}$ is the input current, $V_{out}$ is the output potential, $I_{out}$ is the output current, and the grounding potential GND (=0 V) is the reference potential.

$$\eta = (V_{out} \times I_{out})/(V_{in} \times I_{in}) \qquad (6)$$

The main losses in DC-DC converters include drive loss and conduction loss. Drive loss is the loss occurring due to the charging and discharging of the gates of the high side transistor and the low side transistor when driving those transistors. Conduction loss is the loss occurring due to the ON resistance when a current flows between the source and drain of the high side transistor and the low side transistor. Formula (6) recited above can be expressed as Formula (7) recited below, where $L_{drive}$ is the magnitude of the drive loss and $L_{con}$ is the magnitude of the conduction loss. The denominator of Formula (7) recited below shows that the sum of the output power, the drive loss, and the conduction loss is equal to the input power.

$$\eta = (V_{out} \times I_{out})/(V_{in} \times I_{in}) = (V_{out} \times I_{out})/\{L_{drive} + L_{con} + (V_{out} \times I_{out})\} \qquad (7)$$

As the output power ($V_{out} \times I_{out}$) decreases, the entire numerator and the third term of the denominator of Formula (7) recited above decrease; and the conduction loss $L_{con}$, i.e., the second term of the denominator, also decreases; but the drive loss $L_{drive}$, i.e., the first term of the denominator, does not change. This result is because the drive loss $L_{drive}$ changes in proportion to the product of the gate capacitance and the gate voltage and is not related to the output power.

Therefore, as the output power ($V_{out} \times I_{out}$) decreases, the drive loss $L_{drive}$ can no longer be ignored, and the conversion efficiency η decreases. To begin with, the high side transistor and the low side transistor are designed by assuming that a large current will flow. Therefore, in the case where the output current is small, the device surface area is too large. Therefore, the gate capacitance is large, and the drive loss is large.

Therefore, in the case where the output power decreases as described above, this embodiment causes the gate potentials in the ON state (Vgp and Vgn) of the high side transistor and the low side transistor to approach the gate potentials in the OFF state ($V_{in}$ and GND). Thereby, the absolute values of the gate voltages are reduced and the drive loss $L_{drive}$ is reduced.

As illustrated in FIG. 8, as the absolute value of the gate voltage in the ON state decreases, the amount of charge that charges to and discharges from the gate decreases, and therefore the drive loss $L_{drive}$ decreases. This result is because the amount of charge that charges to and discharges from the gate is determined by the product of the gate capacitance and the gate voltage. On the other hand, as the absolute value of the gate voltage in the ON state decreases, the ON resistance of the high side transistor and the low side transistor increases, and therefore the conduction loss $L_{con}$ increases. Therefore, the total loss of the drive loss and the conduction loss has a minimum point regarding the gate voltage in the ON state; and the gate voltage corresponding to the minimum point is the optimal voltage that maximizes the conversion efficiency.

The conduction loss of each transistor also depends on the length of the time in the ON state. For example, in the case where the output potential is closer to the reference potential than to the input potential as in the case where the input potential is 5 V, the reference potential is 0 V, and the output potential is 1 V, the time that the low side transistor LQ is in the ON state is longer than the time that the high side transistor HQ is in the ON state; and therefore, the conduction loss of the low side transistor LQ is greater than the conduction loss of the high side transistor HQ. Therefore, as illustrated in FIG. 8 and FIG. 9, in a region in which the output current is relatively small, the absolute value of the optimal voltage of the low side transistor LQ becomes greater than the absolute value of the optimal voltage of the high side transistor HQ.

In the case where the switching frequency is high, there is a trend for the absolute value of the optimal voltage in the region in which the output current is low to decrease in comparison to the case where the switching frequency is low. Accordingly, the optimal voltage depends on the relationship among the input potential, the reference potential, and the output potential; the magnitude of the output current; and the switching frequency.

The optimization unit 43 of this embodiment ascertains the optimal potential for each of the high side transistor HQ and the low side transistor LQ based on the magnitude of the output current. Therefore, both transistors can be driven constantly at the optimal voltage. Thereby, the loss can be inhibited, and the conversion efficiency of the DC-DC converter can be increased.

Also, the optimization unit 43 of this embodiment ascertains the optimal potential by referring to the lookup table 48. Therefore, the optimal potential can be accurately and quickly acquired without performing complex operations. Therefore, the hardware of the determination unit 17 can have a simplified configuration; and downsizing and reduced costs are possible. Although the relationship between the magnitude of the output current and the optimal potential differs due to the design of the transistors and the peripheral portions, the relationship does not change much over time. Therefore, if the relationship is calibrated and stored in the storage unit when shipping the DC-DC converter, the relationship can be used continuously thereafter.

This embodiment includes the duty value determination unit 30, and therefore the output potential $V_{out}$ can be continuously compensated to be equal to the referred potential $V_{ref}$ regardless of the state of the load.

The control unit 16 of this embodiment is driven by a digital signal. Therefore, it is possible to provide additional functions such as communication functions, set complex functions, and provide a high functionality in comparison to a power supply controlled by an analog signal.

The value Vgn_tbl[1] written to the first row of the table values of the optimal potential Vgn written to the LUT 48 may be a value such that the gate voltage of the low side transistor LQ is equal to or less than a threshold voltage. Thereby, in the case where the magnitude of the output current which is output from the output terminal $T_{out}$ is extremely small, the gate voltage of the low side transistor LQ is equal to or less than the threshold voltage, and the low side transistor LQ is switched to the OFF state. As a result, the power conversion efficiency can be improved due to the following reasons.

That is, as the output current drops below a certain value while the low side transistor LQ is switched ON, a return current flows from the output terminal $T_{out}$ to the grounding potential GND via the resistor 13, the inductor 11, and the low side transistor LQ. The return current is a wasted current not supplied to the Load. Therefore, the occurrence of the return current reduces the power conversion efficiency.

Therefore, in the case where the return current such as that described above flows during the low side state, the low side transistor LQ is switched to the OFF state. Thereby, the current flowing between the grounding potential GND and the connection point N can flow only via the diode D. However, the direction of the return current is a reverse bias direction of the diode D, and therefore the flow is cut off. As a result, the wasted current can be reduced, and the power conversion efficiency can be improved.

To confirm the improvement effects on the conversion efficiency of this embodiment described above, the DC-DC converter according to this embodiment and a DC-DC converter according to a comparative example were actually constructed, and the conversion efficiencies were compared.

Figure 10:
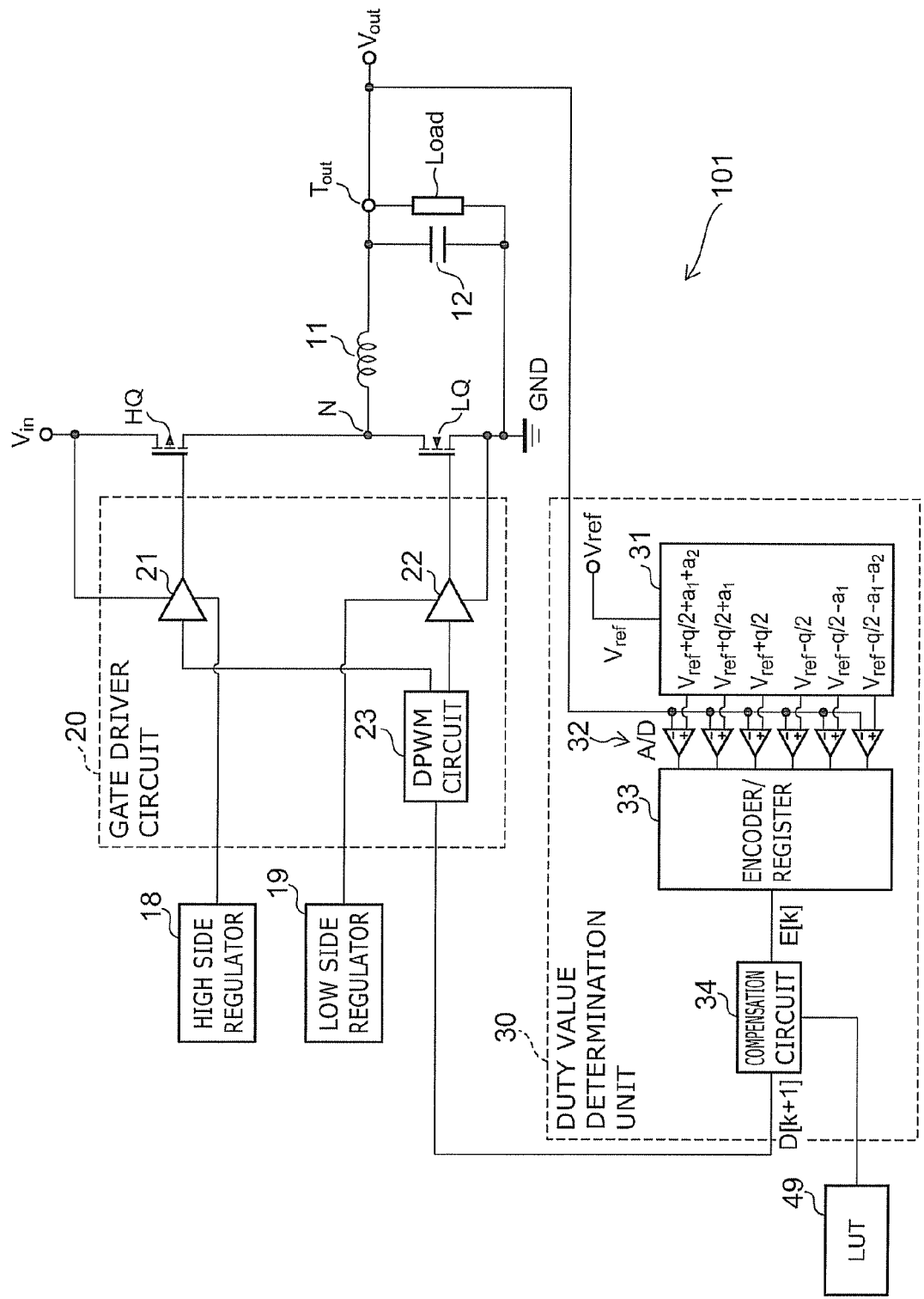
FIG. 10 is a block diagram illustrating a DC-DC converter according to a comparative example.

FIG. 10 is a block diagram illustrating the DC-DC converter according to the comparative example.

Figure 11:
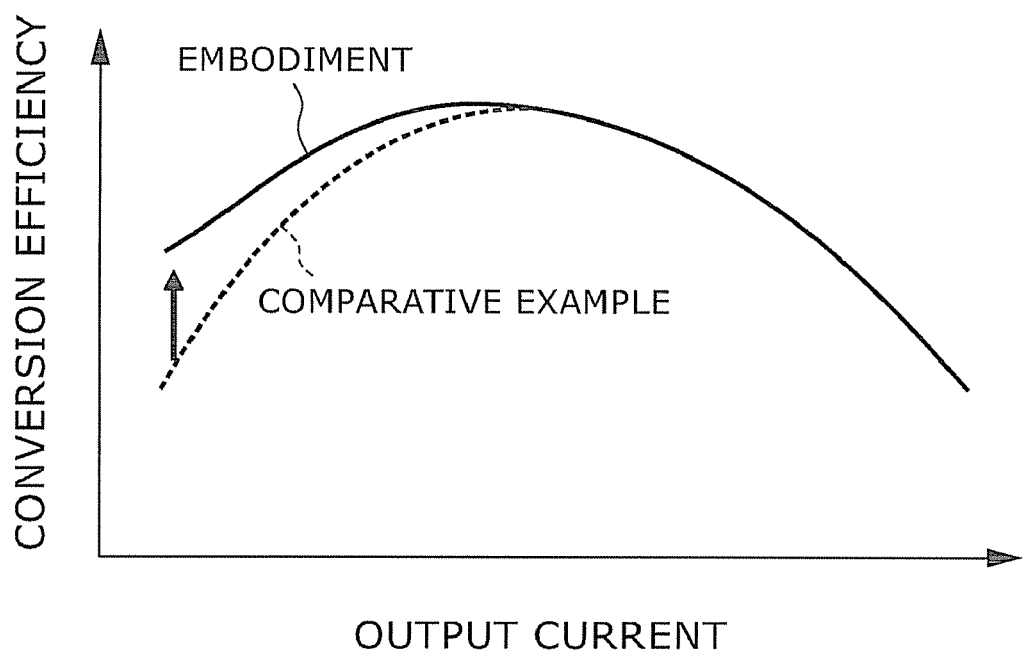
FIG. 11 is a graph comparing a conversion efficiency of the DC-DC converter according to this embodiment to a conversion efficiency of a DC-DC converter according to the comparative example, with a magnitude of the output current on the horizontal axis and the conversion efficiency on the vertical axis.

FIG. 11 is a graph comparing the conversion efficiency of the DC-DC converter according to this embodiment to the conversion efficiency of the DC-DC converter according to the comparative example, with the magnitude of the output current on the horizontal axis and the conversion efficiency on the vertical axis.

In comparison to the DC-DC converter 1 according to the embodiment of the present invention (referring to FIG. 1), a DC-DC converter 101 according to the comparative example does not include the determination unit 17 as illustrated in FIG. 10. Accordingly, the potential which is output by the high side regulator 18 and the potential which is output by the low side regulator 19 are fixed and do not change according to the magnitude of the output current. The duty value determination unit 30 is provided; and the compensation circuit 34 of the duty value determination unit 30 refers to the lookup table 49 and determines the duty value D[k+1].

As illustrated in FIG. 11, a comparison of the conversion efficiencies shows that for a region in which the magnitude of the output current is small, the conversion efficiency of the DC-DC converter according to this embodiment was higher than the conversion efficiency of the DC-DC converter according to the comparative example.

A second embodiment of the present invention will now be described.

Figure 12:
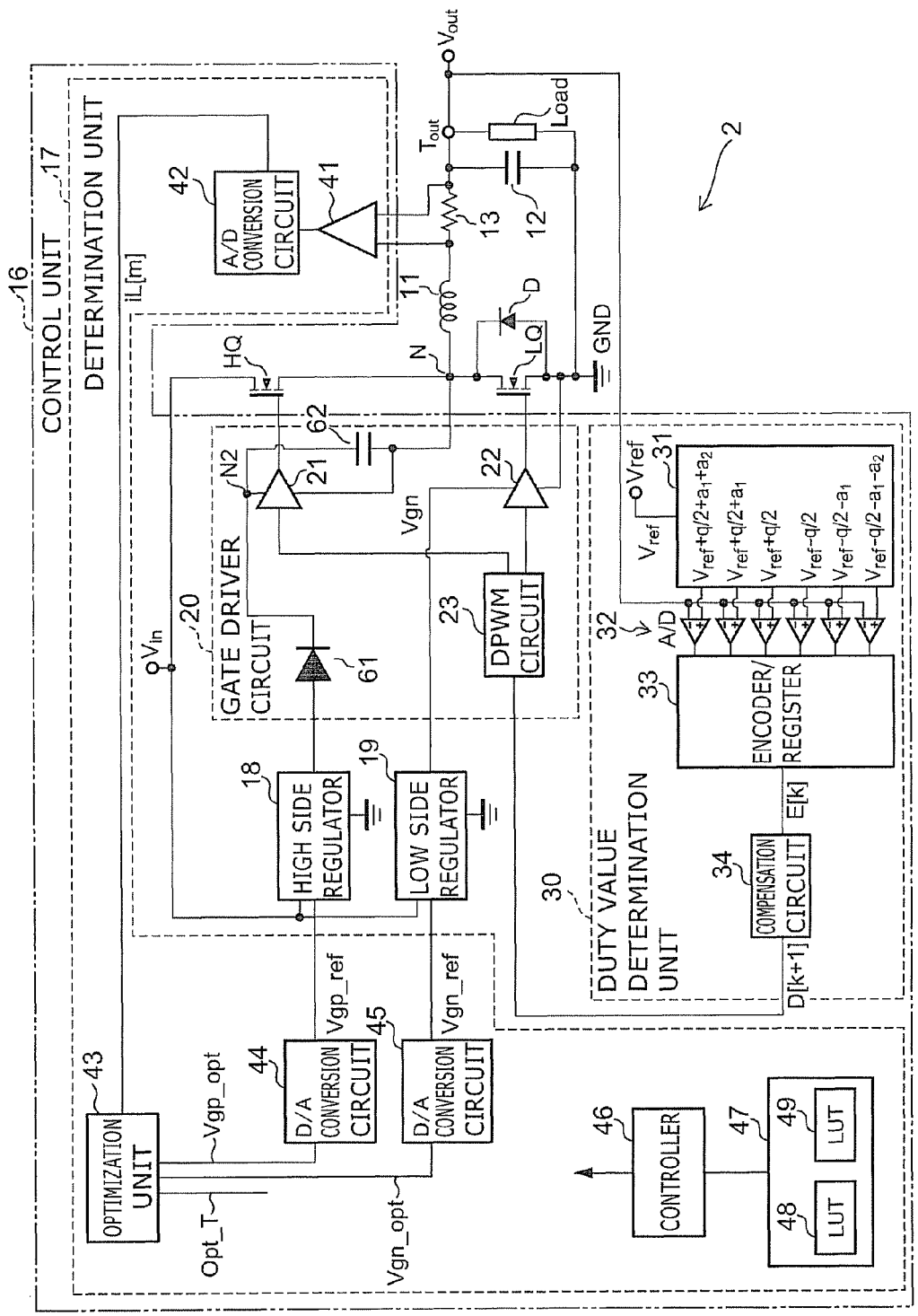
FIG. 12 is a block diagram illustrating a DC-DC converter according to a second embodiment of the invention.

FIG. 12 is a block diagram illustrating a DC-DC converter according to this embodiment.

In comparison to the DC-DC converter 1 according to the first embodiment described above (referring to FIG. 1), the high side transistor HQ of a DC-DC converter 2 according to this embodiment includes an N-channel field effect transistor (NMOS) similar to that of the low side transistor LQ, as illustrated in FIG. 12. In other words, the input potential $V_{in}$ is applied to the drain of the high side transistor HQ; the grounding potential GND is applied to the source of the low side transistor LQ; and the source of the high side transistor HQ and the drain of the low side transistor LQ are mutually connected at the connection point N.

The configuration of the gate driver circuit 20 of the DC-DC converter 2 is different than that of the DC-DC converter 1 described above to supply an appropriate gate potential to the high side transistor HQ formed by an NMOS. Restated, a high potential side input terminal N2 of the high side driver 21 is not connected to the input potential $V_{in}$, but is connected to the output terminal of the high side regulator 18 via a rectifier 61. The rectifier 61 is connected to allow a current to flow only in the direction from the high side regulator 18 toward the input terminal N2. The low potential side input terminal of the high side driver 21 is connected to the connection point N. A capacitor 62 is connected between the high potential side input terminal N2 of the high side driver 21 and the connection point N. The table value of the optimal potential Vgp (Vgp_tbl[j]) and the table value of the optimal potential Vgn (Vgn_tbl[j]) written to the lookup table 48 decrease as the table value of the moving average IL[m] (IL_tbl[j]) decreases. Otherwise, the configuration of this embodiment is similar to that of the first embodiment described above.

An operation of the DC-DC converter according to this embodiment having the configuration described above will now be described.

Similar to the first embodiment described above, the high side transistor HQ and the low side transistor LQ of the DC-DC converter 2 are alternately switched to the ON state.

In the case where the low side transistor LQ is in the ON state and the high side transistor HQ is in the OFF state, the potential of the connection point N is nearly the grounding potential GND; and the grounding potential GND is supplied to the low potential side input terminal of the high side driver 21. Thereby, the high side driver 21 outputs the grounding potential GND to the gate of the high side transistor HQ and maintains the high side transistor HQ in the OFF state based on the control signal input from the DPWM circuit 23.

At this time, Vgp>0, and therefore the rectifier 61 is in the ON state. Thereby, a potential (Vgp−$\Delta V_{61}$) and the grounding potential (GND) are applied to the capacitor 62, where $\Delta V_{61}$ is the voltage drop amount in the forward direction of the rectifier 61. The relationship (Vgp−$\Delta V_{61}$)>(GND) holds. As a result, a charge corresponding to the voltage (Vgp−$\Delta V_{61}$) is accumulated in the capacitor 62.

Then, the high side transistor HQ is switched to the ON state, the low side transistor LQ is switched to the OFF state, and the potential of the connection point N is nearly the input potential $V_{in}$. At this time, the charge corresponding to the voltage (Vgp−$\Delta V_{61}$) is accumulated in the capacitor 62, and therefore the potential of the high potential side input terminal N2 of the high side driver 21 is ($V_{in}$+Vgp−$\Delta V_{61}$). The relationship (Vgp−$\Delta V_{61}$)>0 holds, and therefore the potential of the input terminal N2 is higher than the input potential $V_{in}$. At this time, a reverse bias is applied to the rectifier 61 and the rectifier 61 is switched to the OFF state. Therefore, a current does not flow from the input terminal N2 to the high side regulator 18, and the potential of the input terminal N2 is maintained at ($V_{in}$+Vgp−$\Delta V_{61}$).

As a result, the potential ($V_{in}$+Vgp−$\Delta V_{61}$) which is higher than the input potential $V_{in}$, that is, a potential higher than the source potential of the high side transistor HQ, is supplied from the high side driver 21 to the gate of the high side transistor HQ based on the control signal input from the DPWM circuit 23. At this time, the high side transistor HQ can be maintained in the ON state by setting the value of the potential Vgp such that the voltage (Vgp−$\Delta V_{61}$) is higher than the threshold voltage of the high side transistor HQ.

Thus, the high side driver 21 can alternately apply the grounding potential GND and the potential ($V_{in}$+Vgp−$\Delta V_{61}$) which is higher than the input potential $V_{in}$ to the gate of the high side transistor HQ and switch the state of the high side transistor HQ between the OFF state and the ON state based on the control signal input from the DPWM circuit 23.

Similar to the first embodiment described above, the search circuit 52 refers to the lookup table 48 and acquires the values of Vgp_1 and Vgn_1. In the LUT 48, the table value of the optimal potential Vgp (Vgp_tbl[j]) and the table value of the optimal potential Vgn (Vgn_tbl[j]) decrease as the corresponding table value of the moving average IL[m] (IL_tbl[j]) decreases. Therefore, the optimal potentials Vgp and Vgn, the gate voltage of the high side transistor HQ (Vgp−$\Delta V_{61}$), and the gate voltage of the low side transistor LQ (Vgn−GND) decrease as the moving average IL[m] decreases. Otherwise, the operations of this embodiment are similar to those of the first embodiment described above.

According to this embodiment, an NMOS having higher mobility of carriers than a PMOS can be used as the high side transistor HQ. Therefore, in comparison to the first embodiment described above, the occupied surface area can be smaller in the case where the same ON resistance is designed; and a lower ON resistance is possible in the case where the same occupied surface area is used. Otherwise, the effects of this embodiment are similar to those of the first embodiment described above.

Although the present invention is described with reference to the embodiments hereinabove, the present invention is not limited to these embodiments. For example, all additions, deletions, or design modifications of the components of the embodiments described above appropriately made by one skilled in the art are included in the scope of the present invention to the extent that the spirit of the present invention is included.

For example, although the embodiments described above illustrate examples in which the search circuit 52 divides the values of the moving average IL[m] by rank into ranges thereof to correspond to table values of the optimal potential Vgp_tbl[i] and Vgn_tbl[i], the present invention is not limited thereto. For example, the search circuit 52 may acquire an optimal potential according to the moving average IL[m] by a binary search method.

Further, although the embodiments described above illustrate an example in which the determination unit 17 includes a digital circuit and acquires the values of the optimal potential by referring to the lookup table 48, the present invention is not limited thereto; and the determination unit 17 may include an analog circuit. The analog circuit may include, for example, a low pass filter and a comparator.

Further, although the embodiments described above illustrate an example in which the determination unit 17 includes the current amplifier 41 that measures a voltage between both ends of the resistor 13, evaluates the magnitude of a current flowing in the resistor 13 based on the voltage, and amplifies the magnitude to output an analog signal indicating the magnitude, and the A/D conversion circuit 42 converts the analog signal into a digital signal, the present invention is not limited thereto. The current amplifier 41 may be omitted in the case where the voltage generated between both ends of the resistor 13 is high enough to allow A/D conversion by the A/D conversion circuit 42.

Furthermore, although the embodiments described above illustrate an example in which the magnitude of a current output from the output terminal $T_{out}$ is evaluated by measuring a voltage between both ends of the resistor 13, the present invention is not limited thereto. For example, the ON resistance of the high side transistor HQ and the low side transistor LQ may be used in place of the resistor 13. Specifically, a voltage between the source and drain of the high side transistor HQ and the low side transistor LQ when these transistors are in the ON state is measured and thereby the magnitude of a current output from the output terminal $T_{out}$ is evaluated. Thus, the resistor 13 can be omitted and hence the power loss by the resistor 13 can be avoided.

The invention claimed is:

1. A DC-DC converter comprising:
a high side transistor and a low side transistor connected in series between an input potential and a reference potential;
an LC filter connected between an output terminal and a connection point, the connection point being between the high side transistor and the low side transistor; and
a control unit configured to control a gate voltage of the high side transistor and a gate voltage of the low side transistor according to a magnitude of a current output from the output terminal,
the control unit including:
    a determination unit configured to determine a first optimal gate potential for switching to an ON state for the high side transistor and a second optimal gate potential for switching to an ON state for the low side transistor based on the magnitude of the current;
    a high side regulator configured to generate the first optimal gate potential;
    a low side regulator configured to generate the second optimal gate potential; and
    a gate driver circuit configured to alternately realize a high side state in which the first optimal gate potential generated by the high side regulator is applied to a gate of the high side transistor to switch the high side transistor to an ON state and the low side transistor is switched to an OFF state, and a low side state in which the second optimal gate potential generated by the low side regulator is applied to a gate of the low side transistor to switch the low side transistor to the ON state and the high side transistor is switched to the OFF state,
    wherein the determination unit includes:
        a lookup table to which a relationship between the magnitude of the current and the first and second optimal gate potentials is written;
        an optimization unit configured to acquire a value of at least one of the first optimal gate potential or the second optimal gate potential according to the magnitude of the current by referring to the lookup table;
        a measurement unit configured to measure the magnitude of the current output from the output terminal;
        an analog-to-digital (A/D) conversion circuit configured to convert a measurement result of the measurement unit into a digital signal and supply the digital signal to the optimization unit; and
        a digital-to-analog (D/A) conversion circuit configured to convert a digital signal that indicates the value of the at least one of the first optimal gate potential or the second optimal gate potential acquired by the optimization unit into an analog signal, and wherein the optimization unit includes:
            a low pass filter configured to smooth the digital signal supplied by the A/D conversion circuit to yield a smoothed signal;
            a search circuit configured to refer to the lookup table and acquire a value of at least one of the first optimal gate potential or the second optimal gate potential based on the smoothed signal; and
            a load response detection circuit configured to output the value of the at least one of the first optimal gate potential or the second optimal gate potential acquired by the search circuit in a case where a value of the digital signal supplied by the A/D conversion circuit is not greater than a reference value, and output a value of at least one of the first optimal gate potential or the second optimal gate potential written to the lookup table to substantially maximize the magnitude of the current in a case where the value of the digital signal is greater than the reference value.

2. The DC-DC converter of claim 1, wherein:
the high side transistor is a P-channel field effect transistor,
the low side transistor is an N-channel field effect transistor,
a value of the smoothed signal is written to the lookup table as the magnitude of the current, and
as the value of the smoothed signal decreases, a value of the first optimal gate potential of the high side transistor correspondingly increases and a value of the second optimal gate potential of the low side transistor correspondingly decreases.

3. The DC-DC converter of claim 1, wherein the measurement unit is a current amplifier configured to measure a magnitude of a current flowing in a resistor provided between an inductor of the LC filter and the output terminal by measuring a voltage between both ends of the resistor.

* * * * *